United States Patent
Aigner et al.

(10) Patent No.: US 6,878,604 B2
(45) Date of Patent: Apr. 12, 2005

(54) SEMICONDUCTOR ELEMENT COMPRISING A SEQUENCE OF LAYERS FOR CONVERTING ACOUSTIC OR THERMAL SIGNAL AND ELECTRICAL VOLTAGE CHANGES INTO EACH OTHER AND METHOD FOR PRODUCING THE SAME

(75) Inventors: Robert Aigner, Unterhaching (DE); Lueder Elbrecht, Munich (DE); Thomas Rainer Herzog, Hoehenkirchen-Siegertsbrunn (DE); Stephan Marksteiner, Putzbrunn (DE); Winfried Nessler, Munich (DE)

(73) Assignee: Infineon Technologies AG, Münich (DE)

( * ) Notice: Subject to any disclaimer, the term of this patent is extended or adjusted under 35 U.S.C. 154(b) by 87 days.

(21) Appl. No.: 10/333,727

(22) PCT Filed: Jul. 3, 2001

(86) PCT No.: PCT/EP01/07604
§ 371 (c)(1),
(2), (4) Date: Jan. 21, 2003

(87) PCT Pub. No.: WO02/09131
PCT Pub. Date: Jan. 31, 2002

(65) Prior Publication Data
US 2003/0190792 A1 Oct. 9, 2003

(30) Foreign Application Priority Data
Jul. 20, 2000 (DE) .......................... 100 35 423

(51) Int. Cl.$^7$ .............................................. H01L 21/20
(52) U.S. Cl. ...................... 438/396; 438/379; 310/311; 310/322
(58) Field of Search ................................. 438/379, 381, 438/396; 333/193; 310/311, 321, 322, 334, 348, 366

(56) References Cited

U.S. PATENT DOCUMENTS

| | | | | |
|---|---|---|---|---|
| 6,081,171 A | * | 6/2000 | Ella | 333/189 |
| 6,240,786 B1 | * | 6/2001 | Akiyama et al. | 73/799 |
| 6,420,740 B1 | * | 7/2002 | Zhang et al. | 257/295 |
| 6,528,863 B1 | * | 3/2003 | Klee et al. | 257/595 |
| 6,555,946 B1 | * | 4/2003 | Finder et al. | 310/324 |

OTHER PUBLICATIONS

Lutsky et al, "A Sealed Cavity TFR Process for RF Bandpass Filters", *IEDM*, 1996, pp. 98.

Hiboux et al, "Piezoelectric and Dielectric Properties of Sputter Deposited (111), (100) and Random–Textured Pb(Zr$_x$Ti$_{1-x}$)O$_3$ (PZT) Thin Films", *Ferroelectrics*, 1999, vol. 224, pp. 315–322.

Dubois et al., "Properties of aluminum nitride thin films for piezoelectric transducers and microwave filter applications", *Appl. Phys. Lett.*, vol. 74, No. 20, pp. 3032–3034.

(Continued)

*Primary Examiner*—Amir Zarabian
*Assistant Examiner*—Pamela E Perkins
(74) *Attorney, Agent, or Firm*—Schiff Hardin LLP

(57) ABSTRACT

A semiconductor component is provided having a layer sequence for conversion of acoustic to thermal signals and electrical voltage changes to one another, as well as a process for its production. The layer sequence has a lower electrode, an upper electrode and a layer which is arranged between them and is piezoelectrical or pyroelectrical. An auxiliary layer is arranged between the lower electrode and the layer and is used for homogeneously oriented growth of the layer during the production process. The auxiliary layer preferably consists essentially of amorphous silicon, amorphous silicon oxide or amorphous silicon nitride.

12 Claims, 1 Drawing Sheet

OTHER PUBLICATIONS

Liaw et al, "The Characterization of Sputtered Polycrystalline Aluminum Nitride on Silicon by Surface Acoustic Wave Measurements", *IEEE Transactions on Ultrasonics, Ferroelectrics and Frequency Control*, vol. 42, No. 3, May 1995, pp. 404–409.

Naik et al, "Low–Temperature Deposition of Highly Textured Aluminum Nitride by Direct Current Magnetron Sputtering for Applications in Thin–Film Resonators", *Journal of the Electrochemical Society*, 146 (2), (1999), pp. 691–696.

Lakin et al, "High–Q Microwave Acoustic Resonators and Filters", *IEEE Transactions on Microwave Theory and Techniques*, vol. 41, No. 12, Dec. 1993, pp. 2139–2146.

Ruffner et al, "Effect of Substrate Composition on the Piezoelectric Response of Reactively Sputtered AlN Thin Films", *Thin Solid Films*, 354 (1999), pp. 256–261.

* cited by examiner

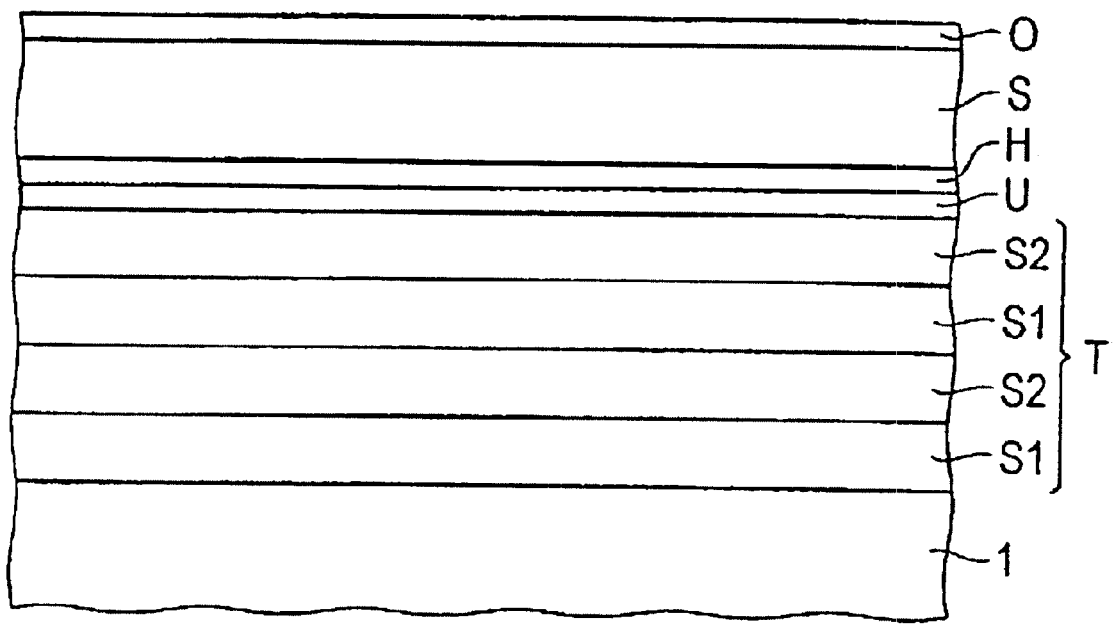
FIG.

SEMICONDUCTOR ELEMENT COMPRISING A SEQUENCE OF LAYERS FOR CONVERTING ACOUSTIC OR THERMAL SIGNAL AND ELECTRICAL VOLTAGE CHANGES INTO EACH OTHER AND METHOD FOR PRODUCING THE SAME

BACKGROUND OF THE INVENTION

1. Field of the Invention

The invention relates to a semiconductor component having a layer sequence for conversion of acoustic or thermal signals and electrical voltage changes to one another, as well as a process for its production.

2. Description of the Related Art

Such semiconductor components typically have a lower electrode, an upper electrode and a layer which is arranged between them and which is piezoelectrical in the situation where acoustic oscillations are produced or detected, and is pyroelectrical in the situation where thermal signals are produced or detected. In both situations, it is desirable for the crystal structure of the layer to have a pronounced texture in order to achieve a piezoelectrical or pyroelectrical coupling coefficient which is as high as possible. The higher this coupling coefficient, the more pronounced are the measurable electrical voltage changes in response to a predetermined acoustic or thermal signal.

A semiconductor component in which acoustic oscillations are produced by the piezoelectrical effect when an electrical voltage change is applied is described, for example, in Dubois, et al., "Properties of aluminum nitride thin films for piezoelectric transducers and microwave filter applications", Appl. Phys. Lett. Vol. 74, No. 20, pages 3032–3034. A layer sequence which is used to produce acoustic oscillations comprises a lower and an upper electrode, and a piezoelectric layer composed of AlN which is arranged between them. In order to improve the texture, the lower electrode may be produced from platinum. Growth of the piezoelectrical layer on platinum results in the layer having a better texture, since platinum and AlN have similar crystal characteristics.

SUMMARY OF THE INVENTION

The invention is based on the object of providing a semiconductor component having a layer sequence for conversion of acoustic or thermal signals and electrical voltage changes for one another whose piezoelectrical or pyroelectrical layer has an improved texture in comparison to the prior art. A further aim is to provide a process for producing such a semiconductor component.

The object is achieved by a semiconductor component having a layer sequence for conversion of acoustic or thermal signals and electrical voltage changes for one another in which the layer sequence has a lower electrode, an upper electrode and a layer which is arranged between them and is piezoelectrical or pyroelectrical, in which an auxiliary layer is arranged between the lower electrode and the layer and is used for homogeneously oriented growth of the layer during the production process, the auxiliary layer consisting essentially of amorphous silicon, amorphous silicon oxide or amorphous silicon nitride.

The object is furthermore achieved by a process for producing a semiconductor component having a layer sequence for conversion of acoustic or thermal signals and electrical voltage changes for one another in which a lower electrode, an auxiliary layer above it, a layer above the auxiliary layer which is piezoelectrical or pyroelectrical, and an upper electrode above the layer are produced as part of the layer sequence, in which the auxiliary layer is produced in such a way that it promotes homogeneous growth of the layer.

DESCRIPTION OF THE DRAWING

An exemplary embodiment of the invention will be explained in more detail in the following text with reference to the FIGURE, which is a cross section through a bulk acoustic wave resonator with a layer sequence comprising a lower electrode, an auxiliary layer, a layer and an upper electrode, as well as a mount.

DETAILED DESCRIPTION OF THE INVENTION

In the inventive layer structuring, the auxiliary layer preferably consists essentially of amorphous silicon, amorphous silicon oxide or amorphous silicon nitride. It has been found that the auxiliary layer, in particular consisting essentially of amorphous silicon, amorphous silicon oxide or amorphous silicon nitride, results in the piezoelectrical or pyroelectrical layer having a considerably better texture. The physical effect on which this is based is that the auxiliary layer according to the invention forms a chemically strictly defined surface thus ensuring that the growth of the piezoelectrical or pyroelectrical layer starts with the same element on all the areas of the auxiliary layer. This surface ensures that the crystallites in the layer are deposited with a defined polarization.

The surface of the auxiliary layer can be passivated. For example, the auxiliary layer on the surface may be oxidized with a thickness of approximately 1 to 2 nm. Alternatively, the auxiliary layer may, for example, be nitrided.

Owing to the low electrical conductivity of the auxiliary layer, there is no need to structure the auxiliary layer. The auxiliary layer may remain as a layer over the entire surface area on semiconductor wafers, without this leading to short circuits between the electrodes.

Furthermore, the auxiliary layer acts as a diffusion barrier for impurities which diffuse out of layers underneath the lower electrode during the deposition of the layer. This characteristic of the auxiliary layer is particularly advantageous, since it has been found that even very minor impurities resulting from oxygen or hydrogen have a sensitive interfering effect on the growth of the piezoelectrical or pyroelectrical layer.

The production process for a semiconductor component according to the invention can be carried out particularly easily since, in particular, deposition of amorphous silicon, amorphous silicon oxide or amorphous silicon nitride is compatible with CMOS manufacture.

The layer consists, for example, essentially of AlN. However, other piezoelectrical or pyroelectrical materials are also suitable.

In the case of semiconductor components which are used to produce or detect acoustic oscillations, the frequency of the acoustic oscillations is governed by the thickness of the layer. If, for example, the semiconductor component resonates at 2 GHz, then the thickness of the layer is about 2 $\mu$m.

The lower electrode and/or the upper electrode are composed, for example essentially or partially of tungsten, molybdenum, platinum or an aluminum alloy, or from a combination of these metals.

It has been found that, in addition to the chemical stability of the surface on which the layer is deposited, the roughness of the surface also significantly influences the quality of the texture of the layer. The crystal growth takes place locally, at right angles to the surface. On rough surfaces, crystallites initially grow with major direction fluctuations, until they block each other's growth and only those crystallites which are directed essentially at right angles still have the capability to grow. The thickness of that part of the layer in which this selection process takes place is highly dependent on the roughness of the surface. Since this portion of the layer has poor piezoelectrical or pyroelectrical characteristics, the coupling coefficient of the layer is considerably worse on a rough surface. In order to reduce the roughness of the surface, it is advantageous to produce the lower electrode by depositing a suitable material, which may then be smoothed by chemical/mechanical polishing (CMP). This process step is particularly advantageous when the lower electrode is produced by deposition of tungsten using a CVD method, since an electrode such as this is particularly rough unless it is smoothed. Since the chemical/mechanical polishing is used only for smoothing, even a short CMP step, in which only 10 to 100 nm is removed, is sufficient.

The auxiliary layer can be produced by sputtering. This step can be carried out in situ or ex situ. In the first case, the layer is applied immediately after the sputtering. In the second case, the auxiliary layer is subjected to the atmosphere before the application of the layer.

The semiconductor component may, for example, be in the form of a bulk acoustic wave resonator, or of a filter with such a bulk acoustic wave resonator. For this purpose, the layer sequence may be arranged on a mount which is designed such that it reflects acoustic oscillations produced by the layer sequence. By way of example, the may mount comprise a number of layers which are arranged one above the other and which alternatively have a high and a low acoustic impedance.

The thickness of the auxiliary layer may preferably be as small as possible in order that the reflection conditions for the mount are satisfied as well as possible. By way of example, the thickness of the auxiliary layer may be between 5 nm and 50 nm.

The semiconductor component may also be in the form of a surface acoustic wave resonator or thin film resonator.

In the exemplary embodiment, according to the FIGURE, starting from a substrate 1 composed of silicon, a mount T may be produced by depositing a sequence of layers S1, S2 which alternatively have a high acoustic impedance and a low acoustic impedance. The layers S1 with the high acoustic impedance may be composed of tungsten and have a thickness of about 850 nm. The layers S2 with the low acoustic impedance may be composed of SiO2 and have a thickness of about 750 nm.

A layer sequence is produced on the mount T. This may be done by first of all depositing tungsten with a thickness of about 400 nm in order to form a lower electrode U. The lower electrode U may then be smoothed by chemical and/or mechanical polishing with tungsten being removed down to a thickness of about 60 nm. An approximately 20 nm thick auxiliary layer H may be produced on the lower electrode U by sputtering of amorphous silicon. Without exposing the substrate 1 to air, a piezoelectrical layer S may then be produced by depositing AlN with a thickness of about 2 $\mu$m. Aluminum may then be deposited with a thickness of about 400 nm on top of this, in order to produce an upper electrode O.

The component which is produced is a bulk acoustic wave resonator. The mount T acts as a Bragg reflector which reflects acoustic waves that are produced by the layer sequence. The thicknesses of the layers S1, S2 are designed such that, at the operating frequency of the bulk acoustic wave resonator, they correspond to ¼ of the acoustic wavelength in the respective material.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The particular implementations shown and described herein are illustrative examples of the invention and are not intended to otherwise limit the scope of the invention in any way. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

LIST OF REFERENCE SYMBOLS

1 Substrate
H Auxiliary layer
O, U Upper, Lower Electrode
S Layer
S1, S2 Layers on the mount T
T Mount

What is claimed is:

1. A semiconductor component, having a layer sequence for conversion of acoustic or thermal signals and electrical voltage changes to one another, the layer sequence comprising:
 a lower electrode;
 an upper electrode;
 a layer which is arranged between the lower electrode and the upper electrode and is piezoelectrical or pyroelectrical; and
 an auxiliary layer arranged between the lower electrode and the layer, the auxiliary layer consisting essentially of amorphous silicon or amorphous silicon oxide, the auxiliary layer being configured to promote homogeneously oriented growth of the layer during the production process.

2. The semiconductor component as claimed in claim 1, wherein the layer consists essentially of AlN.

3. The semiconductor component as claimed in claim 1, wherein the lower electrode and the upper electrode consist essentially of a material selected from the group consisting of tungsten, molybdenum, platinum, an aluminum alloy and a combination of these metals.

4. The semiconductor component as claimed in claim 1, wherein the auxiliary layer is between 5 nm and 50 nm thick.

5. The semiconductor component as claimed in claim 1, wherein the semiconductor component is in the form of a bulk acoustic wave resonator or of a filter, the semiconductor component further comprising a mount on which the layer sequence is arranged, which is configured to reflect acoustic oscillations produced by the layer sequence.

6. The semiconductor component as claimed in claim 1, wherein the lower electrode is polished on a surface which is adjacent to the auxiliary layer.

7. A method for producing a semiconductor component having a layer sequence for conversion of acoustic or thermal signals and electrical voltage changes for one another, the method comprising:

providing a lower electrode;

providing a layer above the lower electrode that is piezo-electrical or pyroelectrical;

providing an auxiliary layer, which consists essentially of amorphous silicon or amorphous silicon oxide, such that this auxiliary layer promotes homogeneously oriented growth of the piezoelectrical or pyroelectrical layer; and providing an upper electrode above the piezoelectrical or pyroelectrical layer.

8. The method as claimed in claim 7, wherein the layer is consists essentially of AlN.

9. The method as claimed in claim 7, wherein the lower electrode and the upper electrode consist essentially of a material selected from the group consisting of tungsten, molybdenum, platinum, an aluminum alloy and a combination of these metals.

10. The method as claimed in claim 7, wherein the auxiliary layer is provided between n 5 nm and 50 nm thick.

11. The method as claimed in claim 7, wherein providing the lower electrode comprises:

depositing tungsten using a CVD process; and then smoothing with at least one of a chemical and mechanical polishing.

12. The method as claimed in claim 7, further comprising:

providing a mount on which the layer sequence is provided, the mount being designed such that it reflects acoustic oscillations produced by the layer sequence, wherein the semiconductor component is produced as a bulk acoustic wave resonator or as a filter.

\* \* \* \* \*